US011694889B2

(12) United States Patent
Chen et al.

(10) Patent No.: US 11,694,889 B2
(45) Date of Patent: Jul. 4, 2023

(54) CHEMICAL MECHANICAL POLISHING CLEANING SYSTEM WITH TEMPERATURE CONTROL FOR DEFECT REDUCTION

(71) Applicant: Taiwan Semiconductor Manufacturing Co., Ltd., Hsinchu (TW)

(72) Inventors: Ssutzu Chen, Kaohsiung (TW); Gin-Chen Huang, New Taipei (TW); Ya-Ting Tsai, Hsinchu (TW); Ying-Tsung Chen, Hsinchu (TW); Kei-Wei Chen, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 413 days.

(21) Appl. No.: 16/807,086

(22) Filed: Mar. 2, 2020

(65) Prior Publication Data

US 2021/0272798 A1 Sep. 2, 2021

(51) Int. Cl.
| H01L 21/02 | (2006.01) |
| B08B 1/00 | (2006.01) |
| B08B 3/12 | (2006.01) |
| B08B 7/00 | (2006.01) |
| B08B 3/08 | (2006.01) |
| B08B 13/00 | (2006.01) |

(Continued)

(52) U.S. Cl.
CPC ........ *H01L 21/02065* (2013.01); *B08B 1/002* (2013.01); *B08B 3/08* (2013.01); *B08B 3/12* (2013.01); *B08B 13/00* (2013.01); *H01L 21/67046* (2013.01); *H01L 21/67051* (2013.01); *H01L 21/67248* (2013.01); *H01L 22/26* (2013.01); *B08B 2203/007* (2013.01)

(58) Field of Classification Search
CPC ......... H01L 21/02065; H01L 21/67046; H01L 21/67051; H01L 21/67248; H01L 22/26; H01L 21/02054; H01L 21/67057; H01L 21/67109; H01L 21/67219; B08B 1/002; B08B 3/08; B08B 3/12; B08B 13/00; B08B 2203/007; B08B 3/02
See application file for complete search history.

(56) References Cited

U.S. PATENT DOCUMENTS 5,333,628 A * 8/1994 Ogata .................... B08B 3/123
134/102.1
5,375,291 A * 12/1994 Tateyama .......... H01L 21/67046
15/302

(Continued)

*Primary Examiner* — Alexander Markoff
(74) *Attorney, Agent, or Firm* — Seed IP Law Group LLP (57) ABSTRACT

A cleaning system includes at least one cleaning module configured to receive a substrate after a chemical mechanical polishing (CMP) process and to remove contaminants on the substrate using a cleaning solution. The cleaning system further includes a cleaning solution supply system configured to supply the cleaning solution to the at least one cleaning module. The cleaning solution supply system includes at least one temperature control system. The at least one temperature control system includes a heating device configured to heat the cleaning solution, a cooling device configured to cool the cleaning solution, a temperature sensor configured to monitor a temperature of the cleaning solution, and a temperature controller configured to control the heating device and the cooling device.

20 Claims, 6 Drawing Sheets

(51) Int. Cl.
 *H01L 21/67* (2006.01)
 *H01L 21/66* (2006.01)

(56) References Cited

U.S. PATENT DOCUMENTS

| | | | | |
|---|---|---|---|---|
| 5,709,755 | A * | 1/1998 | Kuo | H01L 21/67046 |
| | | | | 257/E21.228 |
| 5,853,522 | A * | 12/1998 | Krusell | H01L 21/67046 |
| | | | | 156/345.11 |
| 5,858,109 | A * | 1/1999 | Hymes | B08B 3/08 |
| | | | | 257/E21.228 |
| 6,024,106 | A * | 2/2000 | Yang | H01L 21/67057 |
| | | | | 510/176 |
| 6,099,662 | A * | 8/2000 | Wang | H01L 21/31053 |
| | | | | 134/28 |
| 6,120,616 | A * | 9/2000 | Bahten | B08B 3/08 |
| | | | | 134/28 |
| 6,155,275 | A * | 12/2000 | Shinbara | H01L 21/67173 |
| | | | | 134/147 |
| 6,182,323 | B1 * | 2/2001 | Bahten | B08B 3/08 |
| | | | | 15/244.4 |
| 6,274,059 | B1 * | 8/2001 | Krusell | B08B 1/04 |
| | | | | 134/28 |
| 6,431,959 | B1 * | 8/2002 | Mikhaylich | B24B 37/345 |
| | | | | 451/287 |
| 7,674,695 | B1 * | 3/2010 | Loxley | H01L 21/67057 |
| | | | | 438/692 |
| 2002/0035762 | A1 * | 3/2002 | Okuda | B08B 3/02 |
| | | | | 134/102.1 |
| 2021/0272798 | A1 * | 9/2021 | Chen | H01L 21/67219 |

* cited by examiner

CHEMICAL MECHANICAL POLISHING CLEANING SYSTEM WITH TEMPERATURE CONTROL FOR DEFECT REDUCTION

BACKGROUND

Chemical mechanical polishing (CMP) is widely used in the fabrication of integrated circuits. As an integrated circuit is built up layer by layer on a surface of a substrate (e.g., a semiconductor wafer), CMP processes are used to planarize the topmost layer or layers to provide a planar surface for subsequent fabrication steps. CMP processes are carried out by polishing the substrate surface against a polishing pad as a slurry containing both abrasive particles and reactive chemicals is applied to the polishing pad. The relative movement of the polishing pad and the substrate coupled with the reactive chemicals in the slurry allows the CMP process to planarize the substrate surface by means of both physical and chemical forces. CMP is an effective way to achieve global wafer planarization for advanced integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

CMP processes are widely used for fabrication of various components of integrated circuits. For example, CMP processes are used to planarize inter-layer and inter-metal dielectric layers. CMP processes are also used to form conductive lines that interconnect the components of integrated circuits. CMP processes, however, leave contaminants on the surfaces of the substrate. The contaminants are comprised of residues of abrasive particles from the slurry, which may include alumina or silica, along with residues of chemical additives, such as oxidizing agents, chelating agents, corrosion inhibitors, stabilizing agents, and/or pH adjusting agents, added to the slurry. In addition, the contaminants may comprise residues of reaction products of the slurry and the polished surfaces and particles from the polishing pad. These contaminants adversely affect device reliability and reduce the manufacturing process yield.

Following the CMP process, substrates are subjected to a cleaning process in which the substrates go through a post-CMP cleaner consisting of several cleaning modules. The cleaning modules uses various particle removal technologies such as megasonic cleaning, scrub cleaning, and brush cleaning to remove contaminants from surfaces of the substrates before continuing the construction of the integrated circuits. As scaling of the device sizes, it becomes more important to thoroughly remove CMP residues on a substrate because failure to do so causes defects in the integrated circuits.

In some embodiments, to help to enhance the cleaning efficacy, a temperature control system for adjusting temperatures of a cleaning solution used in the post-CMP cleaning process is provided in a CMP cleaning system. The temperature control system includes a heating device for heating the cleaning solution to a temperature above an ambient temperature, e.g., between about 30° C. and about 100° C., and a cooling device for cooling the cleaning solution to a temperature below the ambient temperature, e.g., between about −10° C. and about 10° C. Compared to removing CMP contaminants using a cleaning solution at an ambient temperature, the post-CMP cleaning process uses a heated or a cooled cleaning solution which allows more thorough removal of CMP contaminants, and as a result, the overall device yield and device reliability are improved.

Figure 1:
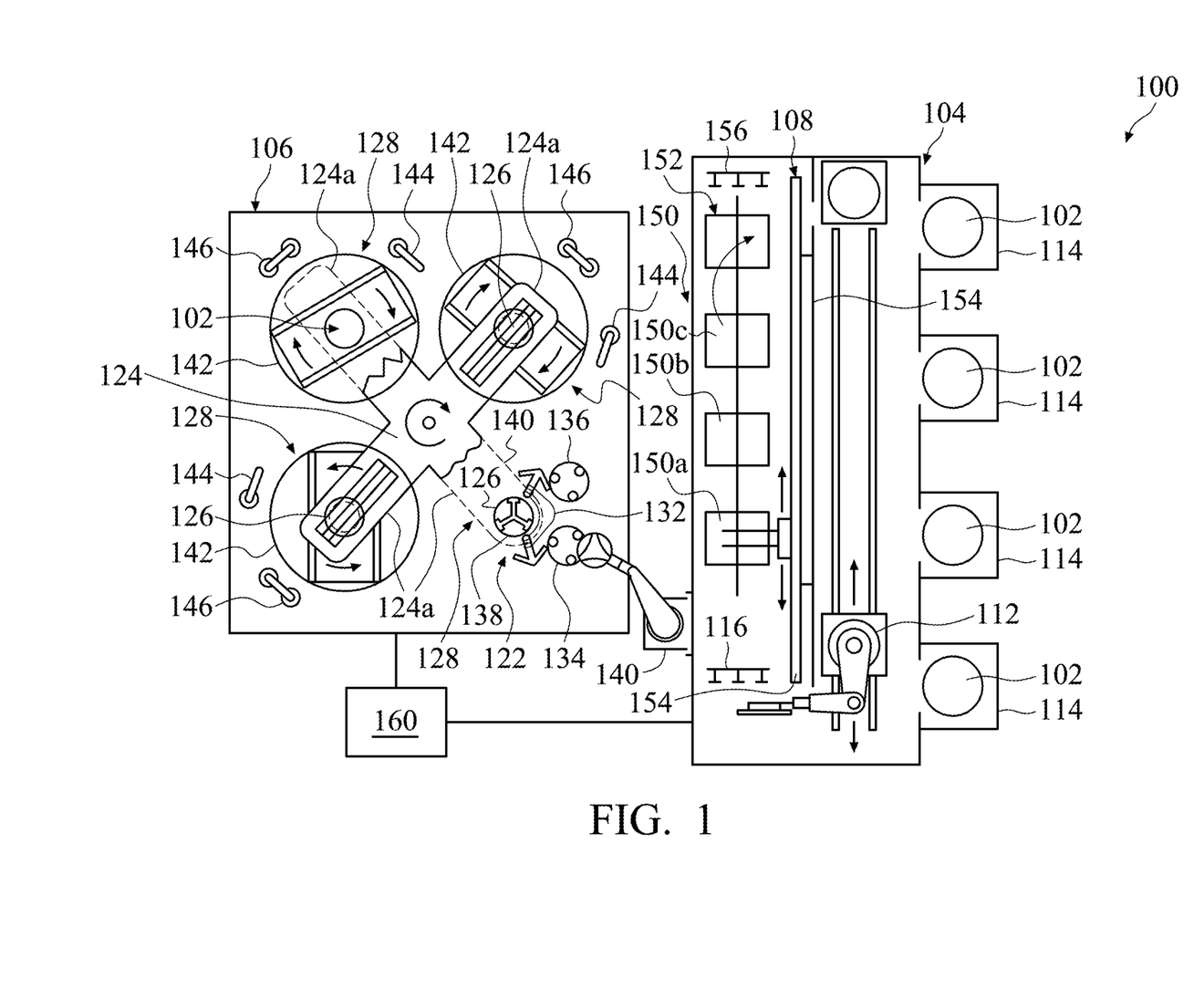
FIG. 1 is a schematic diagram of a chemical mechanical polishing (CMP) system for processing a substrate, in accordance with some embodiments.

FIG. 1 is a schematic diagram of a CMP system 100 for processing a substrate 102, in accordance with some embodiments. In some embodiments, the CMP system 100 includes a factory interface 104, a polishing system 106, and a cleaning system 108. In some embodiments, the CMP system further includes a controller 160. The controller 160 is coupled to the various components of the CMP system 100 to facilitate control of the planarizing, cleaning, and transfer processes.

The factory interface 104 includes an interface robot 112 and one or more substrate cassettes 114. The interface robot 112 is adapted to transfer substrates 102 between the substrate cassettes 114, the cleaning system 108, and an input module 116. The input module 116 is positioned to facilitate transfer of substrates 102 between the polishing system 106 and the factory interface 104.

The polishing system 106 is configured to polish a surface of a substrate 102. In some embodiments, the polishing system 106 includes a transfer station 122, a carousel 124 that supports a plurality of substrate carriers 126 and a plurality of polishing stations 128.

The transfer station 122 generally includes a transfer robot 132, an input buffer station 134, an output buffer station 136, and a load cup assembly 138. The input buffer station 134 receives a substrate 102 from a loading robot 140 that is located on a periphery of the polishing system 106. The transfer robot 132 moves the substrate 102 from the input buffer station 134 to the load cup assembly 138 where the substrate 102 is transferred to a substrate carrier 126.

The carousel 124 includes a plurality of arms 124a each supporting a substrate carrier 126. Two of the arms 124a depicted in FIG. 1 are shown in phantom such that the transfer station 122 and a substrate 102 each held by a corresponding substrate carrier 126 can be seen. The carousel 124 is rotatable to move the substrate carriers 126 around different polishing stations 128 and also from and back to the transfer station 122.

Each polishing station 128 is configured to polish a substrate 102 that is held by a corresponding substrate carrier 126. In some embodiments, the polishing stations 128 are operated to perform a same processing task on different substrates 102. Alternatively, in some embodiments, the polishing stations 128 are operated independently to allow different processing tasks to be performed on different substrates 102 at the same time. Each polishing station 128 includes a polishing pad 142 supported by a platen (not shown), a slurry dispensing arm 144 configured to dispense a slurry to the polishing pad 142, and a pad condition 146 configured to restore the roughness of the polishing pad 142.

The slurry includes abrasive particles that are used in mechanical polishing of the substrate 102 and one or more chemicals such as oxidizing agents, chelating agents, corrosion inhibitors, stabilizing agents, and/or pH adjusting agents that are used in chemical polishing of the substrate 102. During the CMP process, within each polishing station 128, the slurry dispensing arm 144 dispenses the slurry onto the polishing surface of the polishing pad 142. The substrate carrier 126 then presses a substrate 102 against the polishing pad 142 as one or both of the polishing pad 142 and the substrate carrier 126 are rotated with respect to each other. The combined mechanical force and chemical force polishes the surface of the substrate 102 until an endpoint for the CMP operation is reached.

After the CMP process, the contaminants are left on the surface of the substrate 102. In some embodiments, the contaminants include residues of the abrasive particles and chemical additives from the slurry, and residues from the polished surfaces. These contaminants need to be removed using the cleaning system 108 prior to a subsequent processing.

The cleaning system 108 includes a plurality of cleaning modules 150 configured to perform a multi-stage cleaning process. As the substrate 102 is transported through the different cleaning modules 150, the cleaning system 108 removes contaminants from the substrates 102 that remain on surfaces of the substrate 102 after polishing. The cleaning system 108 further includes a drying module 152 configured to dry the substrate 102 at the end of the cleaning sequence. In some embodiments, the drying module 152 is a spin-rinse-dry module within which the substrate 102 is rinsed with deionized wafer and then dried before exiting the cleaning system 108. A substrate handler 154 is operable to retrieve a substrate 102 from the polishing system 106 after polishing and to transfer the substrate 102 sequentially through the plurality of cleaning modules 150 and the drying module 152. An output module 156 is adapted to facilitate substrate transfer between the cleaning system 108 and the substrate cassettes 114 by the interface robot 112 after the post-CMP cleaning process.

In operation, the CMP system 100 is initiated with a substrate 102 being transferred from one of the substrate cassettes 114 to the input module 116 by the interface robot 112. The loading robot 140 then moves the substrate 102 to the transfer station 122 of the polishing system 106. The substrate 102 is loaded into the substrate carriers 126 and is moved over and polished against the polishing pad 142. Once the substrate 102 is polished, the substrate 102 is returned to the transfer station 122 where the loading robot 140 transfers the substrate 102 from the polishing system 106 to the input module 116. The substrate handler 154 then retrieves the substrate 102 from the input module 116 and transfers the substrate 102 through the cleaning modules 150 of the cleaning system 108. After being cleaned in the cleaning system 108, the substrate 102 is returned to one of the substrate cassettes 114 by the interface robot 112.

In some embodiments, the cleaning modules 150 utilized in the cleaning system 108 includes a megasonic cleaning module 150a, a pre-cleaning module 150b, and a brush cleaning module 150c. The multiple cleaning modules 150a, 150b, 150c are configured to perform a multi-stage sequential post-CMP cleaning process on a substrate 102 using different cleaning techniques. The cleaning modules 150a, 150b, 150c are discussed in more detail below with reference to FIG. 2. Although three cleaning modules 150a, 150b, 150c are illustrated and described, it should be understood that the cleaning system 108 may comprise any number of cleaning modules.

Figure 2:
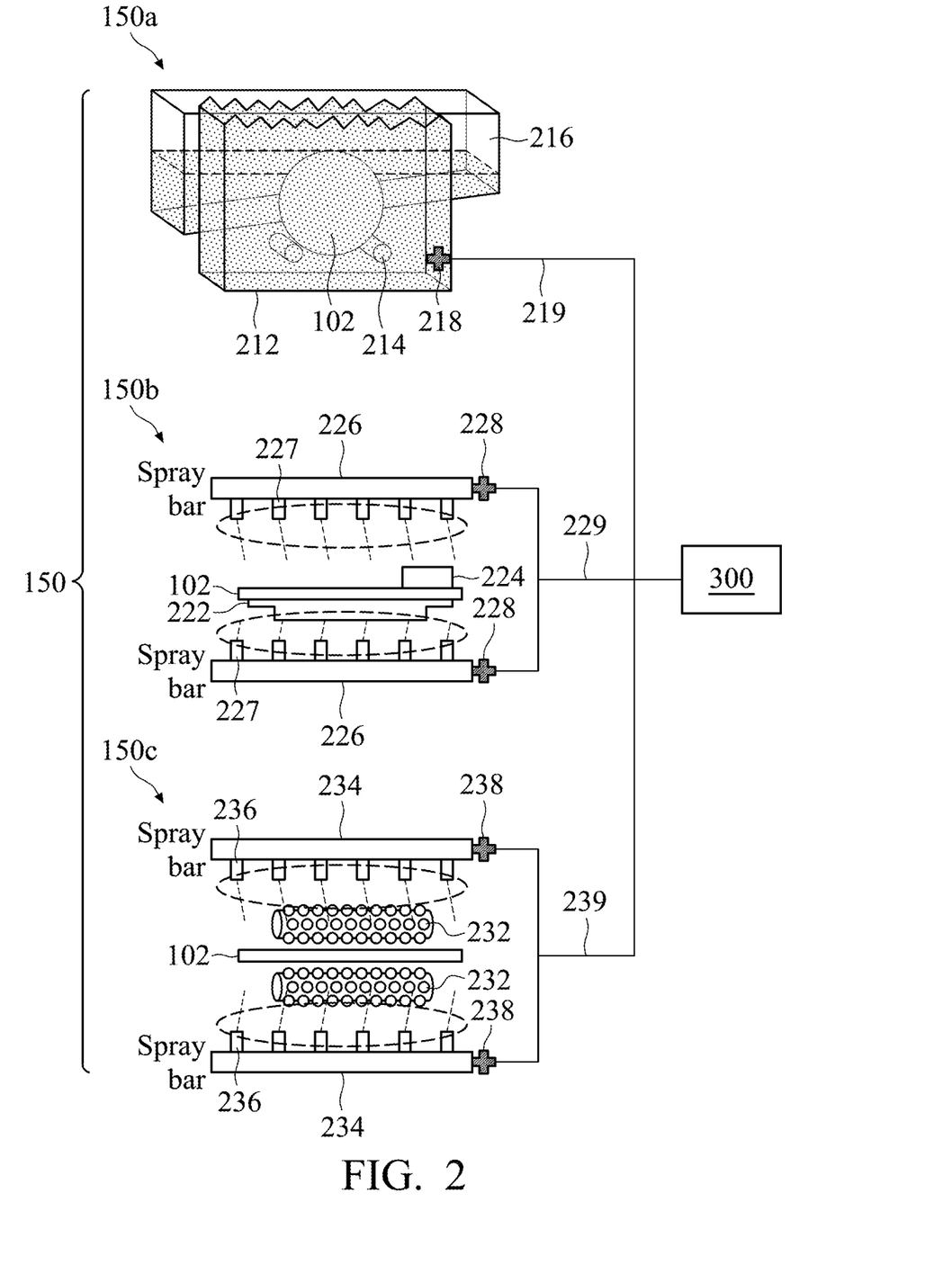
FIG. 2 is schematic diagrams of cleaning modules in the CMP system, in accordance with some embodiments.
Figure 3A:
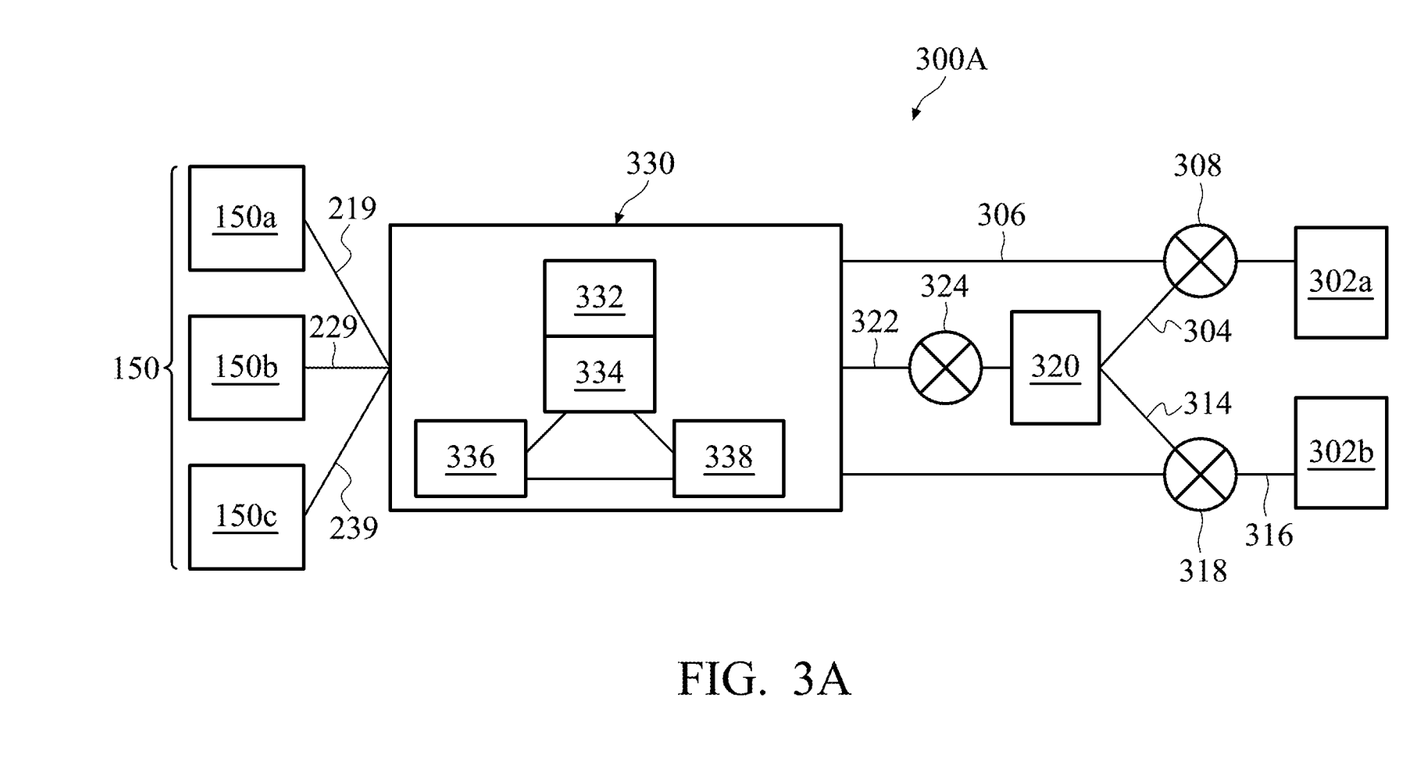
FIG. 3A is a schematic diagram of a cleaning solution supply system, in accordance with some embodiments.
Figure 3B:
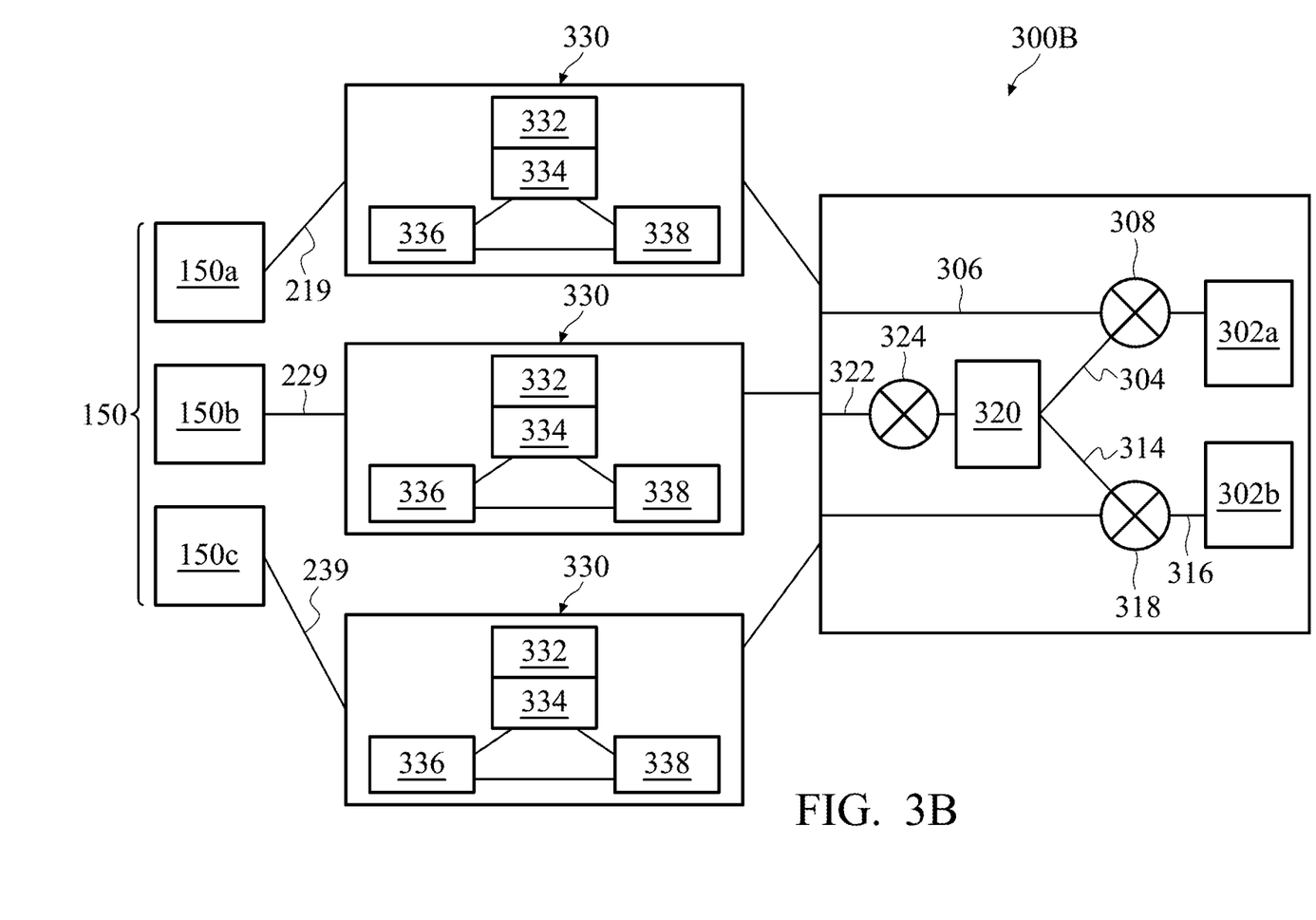
FIG. 3B is a schematic diagram of a cleaning solution supply system, in accordance with some embodiments.

FIG. 2 is schematic diagrams of cleaning modules 150a, 150b, 150c, in accordance with some embodiments. The cleaning modules 150a, 150b, 150c are in fluidic communication with one or more cleaning solution supply systems 300. The cleaning solution supply system 300 is described in more detail below with respect to FIG. 3. In some embodiments, and as shown in FIG. 2, all of the cleaning modules 150a, 150b, and 150c are in fluidic communication with a single cleaning solution supply system 300. Alternatively, in some embodiments, each of the cleaning modules 150a, 150b, and 150c is in fluidic communication with a cleaning solution supply system 300.

The megasonic cleaning module 150a is positioned adjacent to the loading robot 140 (FIG. 1). The megasonic cleaning module 150a receives one or more substrates 102 which have been polished by the polishing system 106 (FIG. 1). In the megasonic cleaning module 150a, one or more substrates 102 are immersed in a cleaning solution (a single substrate 102 is shown). A source of megasonic energy is activated to agitate the cleaning solution and create a cleaning action at the exposed surfaces of one or more substrates 102.

In some embodiments, and as in FIG. 2, the megasonic cleaning module 150a includes a tank 212, such as a quartz tank, which is suitable to hold a cleaning solution therein. A holder 214 is disposed at the bottom of the tank 212 and is configured to vertically support the substrate 102 within a cleaning solution. A transducer (not shown) is placed in physical proximity to the tank 212 so that, once activated, the transducer transmits high frequency acoustic energy into the cleaning solution to agitate the cleaning solution. In some embodiments, the acoustic energy has a frequency in a range from about 500 kHz to about 2.5 MHz. During the megasonic cleaning stage, the megasonic energy agitates the cleaning solution to dislodge contaminants from the surfaces of the substrate 102 into the cleaning solution. The dislodged contaminants are transported out of the tank 212 into an overflow region 216 through the overflow of the cleaning solution.

The tank 212 includes an input port 218 for introduction of the cleaning solution into the tank 212. The input port 218 is connected to an input feed pipe 219 which is in fluidic communication with a cleaning solution supply system, e.g., cleaning solution supply system 300.

The pre-cleaning module 150b is arranged adjacent to the megasonic cleaning module 150a. The pre-cleaning module 150b receives the substrate 102 which has been cleaned by the megasonic cleaning module 150a. In the pre-cleaning module 150b, a front side surface (i.e., the device side surface) of the substrate 102 is scrubbed to remove some of the contaminants from the substrate 102. After the substrate 102 has been processed using the pre-cleaning module 150b, the substrate 102 is automatically transferred to the brush cleaning module 150c.

As shown in FIG. 2, the pre-cleaning module 150b includes a platen 222 configured to support the substrate 102, a scrub pad 224 configured to scrub the front side surface of the substrate 102, and a pair of spray bars 226 configured to spray a cleansing solution via a plurality of nozzles 227 toward front side and backside surfaces of the substrate 102 during the pre-cleaning stage. Each spray bar 226 includes an input port 228 for introduction of a cleaning solution to the spray bar 226. The input ports 228 are coupled to an input feed pipe 229 which is in fluidic communication with a cleaning solution supply system, e.g., cleaning solution supply system 300. During the pre-cleaning stage, the cleaning solution is applied to the front and backside surfaces of the substrate 102, the scrub pad 224 is rotated with respect to the substrate 102 and scrubs the front side surface of the substrate 102 to remove contaminants from the front side surface of the substrate 102.

In some embodiments, the cleaning solution supplied to the pre-cleaning module 150b is the same as the cleaning solution supplied to the megasonic cleaning module 150a. In some embodiments, the cleaning solution supplied to the pre-cleaning module 150b is different from the cleaning solution supplied to the megasonic cleaning module 150a. In some embodiments, the substrate 102 is rinsed before being sent into the pre-cleaning module 150b if a different chemistry from the megasonic cleaning module 150a is to be used in the pre-cleaning module 150b.

The brush cleaning module 150c is arranged adjacent to the pre-cleaning module 150b. The brush cleaning module 150c receives the substrate 102 which has been cleaned by the pre-cleaning module 150b. In the brush cleaning module 150c, both sides (i.e., front side and back side) of the substrate 102 are scrubbed to remove contaminants from the substrate 102. After the substrate 102 has been processed using the brush cleaning module 150c, the substrate 102 is automatically transferred to the drying module 152.

As shown in FIG. 2, the brush cleaning module 150c includes a pair of brushes 232 configured to simultaneously scrub both front and back sides of the substrate 102, and a pair of spray bars 234 configured to spray a cleansing solution via a plurality of nozzles 236 toward opposite sides of the substrate 102 during the brush cleaning stage. Each spray bar 234 includes an input port 238 for introduction of a cleaning solution to the spray bar 234. The input ports 238 are coupled to an input feed pipe 239 which is in fluidic communication with a cleaning solution supply system, e.g., cleaning solution supply system 300. During the brush cleaning stage, the brushes 232 are rotated with respective to the substrate 102. The brushes 232 scrub the front and backside surfaces of the substrate 102 to remove contaminants from both front side surface and backside surface of the substrate 102.

In some embodiments, the cleaning solution supplied to the brush cleaning module 150c is the same as the cleaning solution supplied to the pre-cleaning module 150b. In some embodiments, the cleaning solution supplied to the brush cleaning module 150c is different from the cleaning solution supplied to the pre-cleaning module 150b. In some embodiments, the substrate 102 is rinsed before being sent into the brush cleaning module 150c if a different chemistry from the pre-cleaning module 150b is to be used in the brush cleaning module 150c.

The type of cleaning solution used depends upon types of contaminants to be removed from the substrate 102. In some embodiments, deionized (DI) water is used as the cleaning solution. In some embodiments, an acid such as dicarboxylic acid, hydrofluoric acid (HF) or phosphoric acid ($H_3PO_4$) is used as the cleaning solution. In some embodiments, a base solution such an ammonium hydroxide ($NH_4OH$) is used as the cleaning solution. In some embodiments, a mixed solution is used as the cleaning solution. Examples of the mixed solutions include, but are not limited to, a mixture of an ammonium hydroxide ($NH_4OH$), hydrogen peroxide ($H_2O_2$), and DI water, or a mixture of ammonium hydrogen fluoride ($NH_4F$), HF, and DI water. In some embodiments, a solvent such as, for example, chloroform ($CHCl_3$), dichloromethane ($CH_2Cl_2$), or benzene ($C_6H_6$), acetone (($CH_3)_2CO$), or a mixture thereof is used as the cleaning solution.

To increase the cleaning efficiency, depending on types of contaminants remaining on the substrate 102 and the cleaning solution used, the cleaning solution is either heated to a temperature above an ambient temperature or cooled to a temperature below an ambient temperature before being supplied to individual cleaning modules 150a, 150b, 150c. In some embodiments, the cleaning solution is heated to a temperature between 30° C. to 100° C. In some embodiments, the cleaning solution is cooled to a temperature between −10° C. to 10° C. The heated or cooled cleaning solution helps to remove more contaminants from surfaces of the substrate 102 compared to the cleaning solution at the ambient temperature. As a result, the overall device yield and device reliability are improved.

FIG. 3A is a schematic diagram of a cleaning solution supply system 300A, in accordance with some embodiments. The cleaning solution supply system 300A is adapted to supply a cleaning solution to cleaning modules 150a, 150b, 150c for removing contaminants that remain on surfaces of a substrate 102 after the CMP process. In some embodiments, the cleaning solution supply system 300A includes multiple cleaning fluid source tanks, e.g., a first cleaning fluid source tank 302a and a second cleaning fluid source tank 302b, a chemical mixer 320 configured to mix the chemicals from the cleaning fluid source tanks 302a, 302b, and a temperature control system 330 configured to heat or cool the cleaning solution before supplying to the respective cleaning modules 150a, 150b, 150c.

Each of the cleaning fluid source tanks 302a, 302b is configured to hold a cleaning fluid for preparing the cleaning solution. In some embodiments, the first cleaning fluid source tank 302a is a DI water source tank, and the second cleaning fluid source tank 302b is a chemical source tank. Although two cleaning fluid source tanks are illustrated and described, fewer or more cleaning fluid source tanks can be provided depending on the compositions of the cleaning solution to be used in each post-CMP cleaning stage.

In some embodiments, the first cleaning fluid source tank 302a is configured to supply DI water directly to the temperature control system 330 or alternatively to the chemical mixer 320 for diluting a chemical fluid from the second cleaning fluid source tank 302b. The first cleaning fluid source tank 302a is coupled to the chemical mixer 320 via a pipe 304 and coupled to the temperature control system 330 via a pipe 306. A valve 308 is coupled to the pipe 304 and pipe 306. In some embodiments, the valve 308 is a two-way valve such that in one valve position, the valve 308 fluidly couples the first cleaning fluid source tank 302a to the chemical mixer 320, thus allowing the DI water flow from the first cleaning fluid source tank 302 to the chemical mixer 320; and in the other valve position, the valve 308 fluidly couples the first cleaning fluid source tank 302a to the temperature control system 330 to allow the DI water flow directly from the first cleaning fluid source tank 302a to the temperature control system 330.

The second cleaning fluid source tank 302b is configured to supply a chemical fluid directly to the temperature control system 330 or alternatively to the chemical mixer 320 within which the chemical fluid is mixed with DI water or one or more other chemical fluids. In some embodiments, the chemical fluid includes an acid or a base such as, for example, hydrofluoric acid (HF), phosphoric acid ($H_3PO_4$), ammonium hydroxide ($NH_4OH$), or ammonium hydrogen fluoride ($NH_4F$). In some embodiments, the chemical fluid includes a solvent such as, for example, chloroform ($CHCl_3$), dichloromethane ($CH_2Cl_2$), or benzene ($C_6H_6$), acetone (($CH_3)_2CO$). The second cleaning fluid source tank 302b is coupled to the chemical mixer 320 via a pipe 314 and coupled to the temperature control system 330 via a pipe 306. A valve 318 is coupled to the pipe 314 and pipe 316. In some embodiments, the valve 318 is a two-way valve such that in one valve position, the valve 318 fluidly couples the second cleaning fluid source tank 302b to the chemical mixer 320, thereby allowing the chemical fluid flow from the second cleaning fluid source tank 302b to the chemical mixer 320; and in the other valve position, the valve 318 fluidly couples chemical source tank 302b directly to the temperature control system 330 to allow the chemical fluid flow from the second cleaning fluid source tank 302b to the temperature control system 330.

The chemical mixer 320 is configured to mix one or more chemical fluids with the DI water or to mix different chemical fluids. The chemical mixer 320 includes a mixing element adapted to mix and/or homogenize the flow of fluids prior to transporting the mixture into the temperature control system 330. In some embodiments, the mixing element is a static mixer, a dynamic mixer, and inductive mixer, or a mechanical mixer. The chemical mixer 320 is coupled to the temperature control system 330 via a pipe 322. A valve 324 is coupled to the pipe 322. The opening of the valve 324 allows the mixture of chemical fluids to flow from the chemical mixer 320 to the temperature control system 330.

The temperature control system 330 is configured to heat or cool the cleaning solution as the cleaning solution passing through to a predetermined temperature before the cleaning solution is supplied to respective cleaning modules 150a, 150b, 150c, thereby facilitating the removal of the contaminants on surfaces of a substrate (e.g., substrate 102) resulting from the CMP process. In some embodiments, the temperature control system 330 includes a heating device 332, a cooling device 334, a thermal sensor 336, and a temperature controller 338. Although the heating device 332 and the cooling device 334 are depicted as separate elements, it should be understood that the temperature control system 330 may include a single heating/cooling device which contain both heating and cooling elements. In some embodiments, the temperature control system 330 may include a display, for example, a light emitting diode (LED) display or a liquid crystal display (LCD). The display may show information relating to the temperature control system 330, for example, the temperature from the thermal sensor 336. In some embodiments, the temperature control system 330 may also include a power source configured to provide power to various components of the temperature control system 330.

The heating device 332 is configured to heat the cleaning solution to a temperature above the ambient temperature to facilitate removal of the contaminants from surfaces of the substrate 102. In some embodiments, the heating device 332 is configured to heat the cleaning solution to a temperature between about 30° C. to about 100° C. If the temperature is too low, the cleaning efficiency of the cleaning solution is decreased, in some instances. If the temperature is too high, there is a risk that the substrate is melt or the cleaning solution is boiled, in some instances. In some embodiments, the heating device 332 is a resistance heater to generate heat.

The cooling device 334 is configured to cool the cleaning solution to a temperature below the ambient temperature to facilitate removal of the contaminants from surfaces of the substrate 102. In some embodiments, the cool device 334 is configured to cool the cleaning solution to a temperature between about −10° C. to about 10° C. If the temperature is too low, there is a risk that the cleaning solution is frozen, in some instances. If the temperature is too high, the cleaning efficiency of the cleaning solution is decreased, in some instances. In some embodiments, the cooling device is a refrigeration compressor to generate a cooling flow (coolant or de-ionized water).

The temperature sensor 336 is configured to monitor the temperature of the cleaning solution, and to provide signals to a temperature controller 338 which controls power to the heating device 332 or the cooling device 334. In some embodiments, the temperature sensor 336 is a thermocouple. The thermocouple may include any type thermocouples such as, for example, type S, B, K, E, J, T, or N. Characteristics of several standardized thermocouple types are summarized in Table 1. In some embodiments, the temperature sensor 336 is a resistance temperature detector. In some embodiments, the temperature sensor 336 is a thermistor.

TABLE 1

| Thermocouple Type | Sensitivity | Operating Range |
| --- | --- | --- |
| Type S (platinum) | 10 µV/° C. | 0° C.-1750° C. |
| Type B (platinum) | 10 µV/° C. | 50° C.-1800° C. |
| Type K (chromel-alumel) | 41 µV/° C. | −200° C.-1200° C. |
| Type E (chromel-constantan) | 68 µV/° C. | −200° C.-900° C. |
| Type J (iron-constantan) | 55 µV/° C. | −40° C.-750° C. |
| Type T (copper-constantan) | 43 µV/° C. | −200° C.-350° C. |
| Type N (nicrosil-nisil) | 39 µV/° C. | up to 1300° C. |

The temperature controller 338 is configured to receive signals from the temperature sensor 336 and based on the information from the temperature sensor 336, to control the operation of the heating device 332 and the cooling device 334. In some embodiments, the temperature controller 338 adjusts the power delivered to the heating device 332 or the cooling device 334 to control the temperature of the cleaning solution, e.g., a target temperature (i.e., predetermined temperature) that is either above or below the ambient temperature. The target temperature is determined based on types of contaminants to be removed. After the temperate of the cleaning solution has reached the target temperature, the cleaning solution is supplied to respective cleaning modules 150a, 150b, 150c via respective input feed pipes 219, 229, 239.

Depending on the type of cleaning solution used in respective cleaning modules 150a, 150b, 150c and the type of contaminants to be cleaned, in some embodiments, the temperatures of the cleaning solutions that are delivered to different cleaning modules, i.e., megasonic cleaning module 150a, pre-cleaning module 150b, brush cleaning module 150c, are the same, while in other embodiments, the temperatures of the cleaning solutions that are delivered to different cleaning modules, i.e., megasonic cleaning module 150a, pre-cleaning module 150b, brush cleaning module 150c, are different.

FIG. 3B is a schematic diagram of a cleaning solution supply system 300B, in accordance with some embodiments. In some embodiments, the difference between the cleaning solution supply system 300B and the cleaning solution supply system 300A shown in FIG. 3A is that in cleaning solution supply system 300B, each cleaning module, i.e., megasonic cleaning module 150a, pre-cleaning module 150b, brush cleaning module 150c, is provided with a temperature control system 330 to control temperatures of the cleaning solution flowed to each corresponding cleaning module 150a, 150b, 150c. The cleaning solution supply system 300B, thus, allows providing cleaning solutions with different temperatures to respective cleaning modules 150a, 150b, 150c at the same time.

Figure 4:
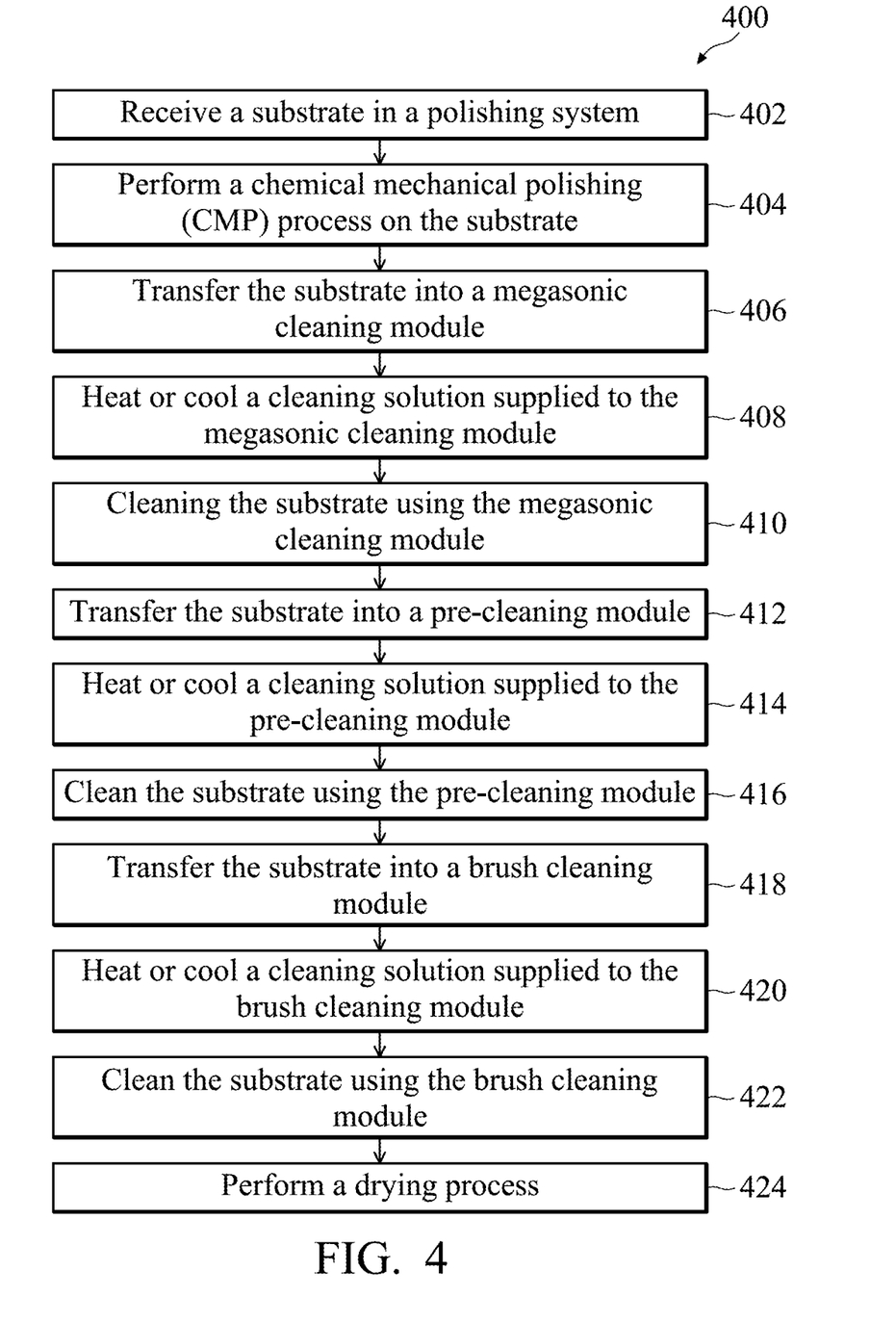
FIG. 4 is a flowchart of a method of cleaning a substrate after a CMP process, in accordance with some embodiments.

FIG. 4 is a flow chart illustrating a method 400 for cleaning a substrate using a CMP system, e.g., CMP system 100, in accordance with some embodiments. For illustration, the flow chart will be described with the schematic views shown in FIGS. 1-3B. Some of the stages described can be replaced or eliminated for different embodiments. Additional features can be added in the semiconductor device structure. Some of the features described below can be replaced or eliminated for different embodiments.

The method 400 includes an operation 402 in which one or more substrates, e.g., substrates 102, is provided into a polishing system such as polishing system 106. In some embodiments, the substrate 102 is transferred into the polishing system 106 by one or more robots such as interface robot 112 and loading robot 140 from a substrate cassette 114.

The method 400 continues with operation 404, in which a CMP process is performed. During the CMP process, a slurry is applied to a polishing pad 142 of the polishing system 106 and the substrate 102 is polished by a polishing pad 142 using the slurry. After polishing, contaminants such as slurry residues and polishing residues remain on the substrate 102.

The method 400 continues with operation 406, in which after the substrate 102 is polished, the substrate 102 is removed from the polishing system 106 and transferred to the megasonic cleaning module 150a.

The method 400 continues with operation 408, in which a cleaning solution with a target temperature is supplied from the cleaning solution supply system 300 into the megasonic cleaning module 150a. Depending on the type of cleaning solution used, the cleaning solution is either heated by the heating device 332 or cooled by the cooling device 334 in the temperature control system 300 to reach the target temperature at which the improved contaminant removal efficiency is obtained. The temperature of the cleaning solution is monitored by the temperature sensor 336. The information provided by the temperature sensor 336 is used by the temperature controller 338 to control the operation of the heating device 332 or the cooling device 334.

The method 400 continues with operation 410, in which a first cleaning process is performed using the megasonic cleaning module 150a. During the first cleaning process, the substrate 102 is immersed into the heated or cooled cleaning solution and a megasonic energy is applied to the cleaning solution to agitate the cleaning solution, thereby dislodging contaminants from surfaces of the substrate 102.

The method 400 continues with operation 412, in which after the substrate 102 is cleaned using the megasonic module 150a, the substrate 102 is removed from the megasonic module 150a and transferred into the pre-cleaning module 150b.

The method 400 continues with operation 414, in which a cleaning solution with a target temperature is supplied from the cleaning solution supply system 300 into the pre-cleaning module 150b. Depending on the type of cleaning solution used, the cleaning solution is either heated by the heating device 332 or cooled by the cooling device 334 in the temperature control system 300 to reach the target temperature at which the improved contaminant removal efficiency is obtained. The temperature of the cleaning solution is monitored by the temperature sensor 336. The information provided by the temperature sensor 336 is used by the temperature controller 338 to control the operation of the heating device 332 or the cooling device 334.

The method 400 continues with operation 416, in which a second cleaning process is performed using the pre-cleaning module 150b. During the second cleaning process, a front side surface of the substrate 102 is scrubbed by the cleaning pad 222 as the heated or cooled cleaning solution is sprayed to both front side surface and backside surface of the substrate 102, thereby removing contaminants from surfaces of the substrate 102.

The method 400 continues with operation 418, in which after the substrate 102 is cleaned using the pre-cleaning module 150b, the substrate 102 is removed from the pre-cleaning module 150b and transferred into the brush cleaning module 150c.

The method 400 continues with operation 420, in which a cleaning solution with a target temperature is supplied from the cleaning solution supply system 300 into the brush cleaning module 150c. Depending on the type of cleaning solution used, the cleaning solution is either heated by the heating device 332 or cooled by the cooling device 334 in the temperature control system 300 to reach the target temperature at which the improved contaminant removal efficiency is obtained. The temperature of the cleaning solution is monitored by the temperature sensor 336. The information provided by the temperature sensor 336 is used by the temperature controller 338 to control the operation of the heating device 332 or the cooling device 334.

The method 400 continues with operation 422, in which a third cleaning process is performed using the brush cleaning module 150c. During the third cleaning process, both front side surface and backside surface of the substrate 102 are scrubbed by respective cleaning brushes 232 as a heated or cooled cleaning solution is sprayed to the front side and backside surfaces of the substrate 102, thereby removing contaminants from surfaces of the substrate 102.

The method continues with operation 424, in which after sequential cleaning stages to substantially remove contaminants from surfaces of the substrate 102, the substrate 102 is transferred to the drying module 152 where the substrate 102 is rinsed, spun, and dried, for example, by DI water and isopropyl alcohol (IPA).

Figure 5:
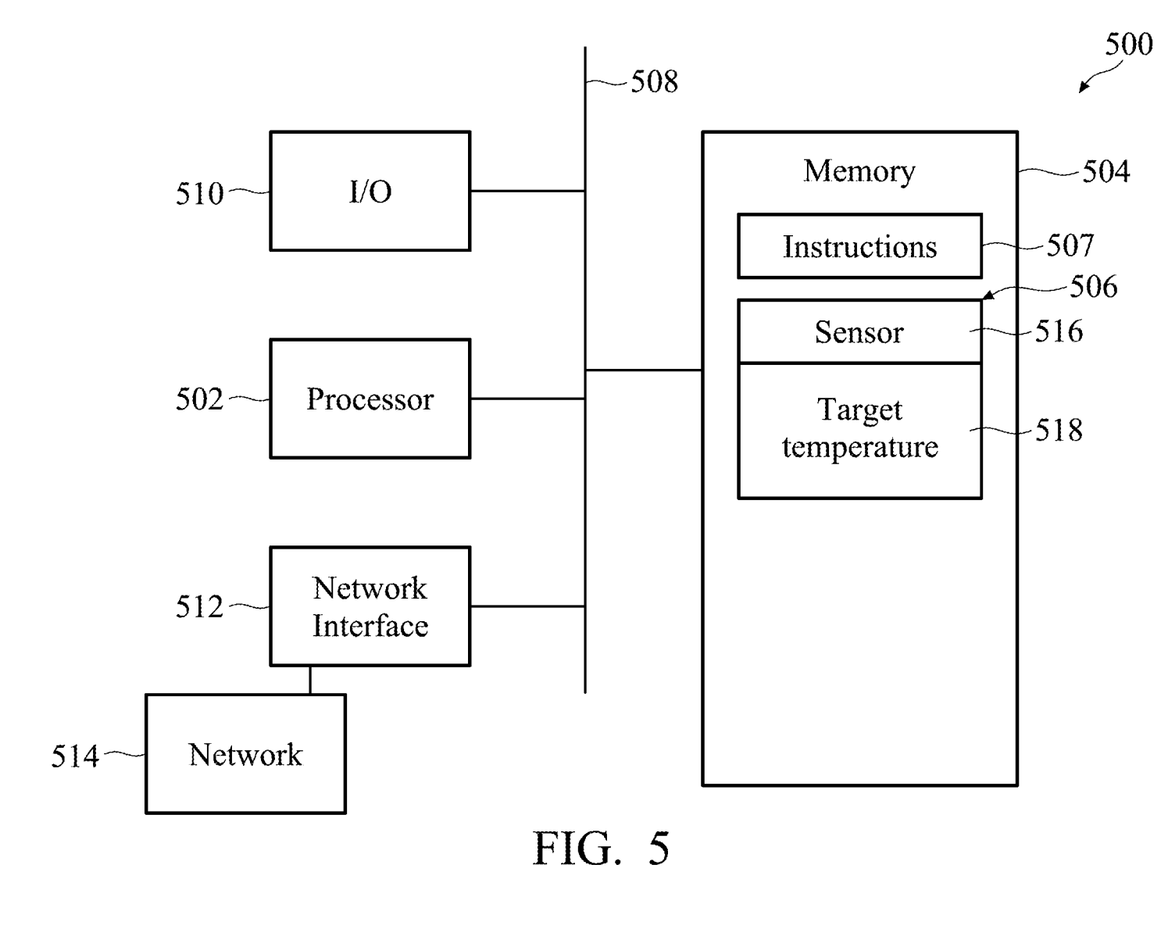
FIG. 5 is a diagram of a control system for controlling a CMP system, in accordance with some embodiments.

FIG. 5 is a block diagram of a control system 500 for controlling a CMP system 100, in accordance with some embodiments. The control system 500 generates output control signals for controlling operation of one or more components of CMP system 100, in accordance with some embodiments. The control system 500 receives input signals from one or more components of the CMP system 100, in accordance with some embodiments. In some embodiments, the control system 500 is located adjacent CMP system 100. In some embodiments, the control system 500 is remote from the CMP system, 100. In some embodiments, controller 160 (FIG. 1) and controller 338 (FIGS. 3A and 3B) are implemented using the control system 500.

Control system 500 includes a processor 502 and a non-transitory, computer readable storage medium 504 encoded with, i.e., storing, computer program code 506, i.e., a set of executable instructions. Computer readable storage medium 504 is also encoded with instructions 507 for interfacing with components of CMP system 100. The processor 502 is electrically coupled to the computer readable storage medium 504 via a bus 508. The processor 502 is also electrically coupled to an I/O interface 510 by bus 508. A network interface 512 is also electrically connected to the processor 502 via bus 508. Network interface 512 is connected to a network 514, so that processor 502 and computer readable storage medium 504 are capable of connecting to external elements via network 514. The processor 502 is configured to execute the computer program code 506 encoded in the computer readable storage medium 504 in order to cause control system 500 to be usable for performing a portion or all of the operations as described with respect to CMP system 100.

In some embodiments, the processor 502 is a central processing unit (CPU), a multi-processor, a distributed processing system, an application specific integrated circuit (ASIC), and/or a suitable processing unit.

In some embodiments, the computer readable storage medium 504 is an electronic, magnetic, optical, electromagnetic, infrared, and/or a semiconductor system (or apparatus or device). For example, the computer readable storage medium 504 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the storage medium 504 stores the computer program code 506 configured to cause control system 500 to perform the operations as described with respect to CMP system 100. In some embodiments, the storage medium 504 also stores information needed for performing the operations as described with respect to CMP system 100, such as a sensor parameter 516, a target temperature parameter 518, and/or a set of executable instructions to perform the operation as described with respect to CMP system 100.

In some embodiments, the storage medium 504 stores instructions 507 for interfacing with CMP system 100. The instructions 507 enable processor 502 to generate operating instructions readable by elements of the CMP system 100 to effectively implement the operations as described with respect to CMP system 100.

Control system 500 includes I/O interface 510. I/O interface 510 is coupled to external circuitry. In some embodiments, I/O interface 510 includes a keyboard, keypad, mouse, trackball, trackpad, and/or cursor direction keys for communicating information and commands to processor 502.

Control system 500 also includes network interface 512 coupled to the processor 502. Network interface 512 allows control system 500 to communicate with network 514, to which one or more other computer systems are connected. Network interface 512 includes wireless network interfaces such as BLUETOOTH, WIFI, WIMAX, GPRS, or WCDMA; or wired network interface such as ETHERNET, USB, or IEEE-1394.

Control system 500 is configured to receive information related to the temperature sensor, e.g., temperature sensor 336 (FIGS. 3A and 3B), through I/O interface 510. The information is transferred to processor 502 via bus 508 and then stored in computer readable medium 504 as sensor parameter 516. Control system 500 is configured to receive information related to the target temperature through I/O interface 510. In some embodiments, the target temperature information is received from an operator. The information is stored in computer readable medium 504 as target temperature parameter 518.

During operation, in some embodiments, processor 502 executes a set of instructions to determine whether the temperature of the cleaning solution has reached a target temperature. Based on the above determinations, processor 502 generates a control signal to instruct the heating device 332 or the cooling device 334 to adjust the temperature of the cleaning solution. In some embodiments, the control signal is transmitted using I/O interface 510. In some embodiments, the control signal is transmitted using network interface 512.

One aspect of this description relates to a cleaning system. The cleaning system includes at least one cleaning module configured to receive a substrate after a chemical mechanical polishing (CMP) process and to remove contaminants on the substrate using a cleaning solution. The cleaning system further includes a cleaning solution supply system configured to supply the cleaning solution to the at least one cleaning module. The cleaning solution supply system includes at least one temperature control system containing a heating device configured to heat the cleaning solution, a cooling device configured to cool the cleaning solution, a temperature sensor configured to monitor a temperature of the cleaning solution, and a temperature controller configured to control the heating device and the cooling device. In some embodiments, the at least one cleaning module includes a megasonic cleaning module configured to remove the contaminants from a front side surface and a backside surface of the substrate using megasonic energy. In some embodiments, the at least one cleaning module includes a pre-cleaning module configured to remove the contaminants from a front side surface of the substrate using a pad. In some embodiments, the at least one cleaning module includes a brush cleaning module configured to remove the contaminants from a front side and a backside of the substrate using a pair of brushes. In some embodiments, the heating device is configured to heat the cleaning solution from about 30° C. to about 100° C. In some embodiments, the cooling device is configured to cool the cleaning solution from about −10° C. to 10° C. In some embodiments, the temperature sensor includes a thermocouple, a resistance temperature detector, or a thermistor. In some embodiments, the cleaning solution includes an acidic solution or a base solution. In some embodiments, the cleaning solution comprises hydrofluoric acid, phosphoric acid, ammonium hydroxide, hydrogen peroxide, or a mixture thereof. In some embodiments, the cleaning solution includes deionized water. In some embodiments, the cleaning solution includes chloroform, dichloromethane, or benzene, acetone, or mixtures thereof.

Another aspect of this description relates to a chemical mechanical polishing (CMP) system. The CMP system includes a polishing system configured to polish a substrate. The CMP system further incudes a cleaning system configured to remove contaminants remaining on the substrate after the substrate has been polished in the polishing system. The cleaning system includes a plurality of cleaning modules. A first cleaning module of the plurality of cleaning modules is configured to perform a first cleaning process and a second cleaning module of the plurality of cleaning modules is configured to perform a second cleaning process. The cleaning system further includes a cleaning solution supply system configured to supply a first cleaning solution of a first temperature to the first cleaning module and a second cleaning solution of a second temperature to the second cleaning module. The first temperature is different from the second temperature. In some embodiments, the first cleaning solution is different from the second cleaning solution. In some embodiments, the cleaning solution supply system includes a plurality of cleaning fluid source tanks each of which is configured to hold a cleaning fluid, a chemical mixer configured to mix two or more cleaning fluids from the plurality of cleaning fluid source tanks, and a temperature control system, wherein the temperature control system is configured to heat or cool a cleaning solution from respective cleaning fluid source tanks or the chemical mixer to a predetermined temperature. In some embodiments, the temperature control system includes a heating device configured to heat the cleaning solution, a cooling device configured to cool the cleaning solution, a temperature sensor configured to monitor a temperature of the cleaning solution, and a temperature controller configured to control the heating device and the cooling device.

Yet another aspect of this description relates to a method of cleaning a substrate following a chemical mechanical polishing (CMP) process. The method includes providing a substrate in need of removing CMP contaminants into a cleaning module, supplying a cleaning solution to the cleaning module, the cleaning solution having a temperature above or below an ambient temperature, and removing the CMP contaminants from the substrate using the cleaning solution. In some embodiments, the method further includes heating the cleaning solution from about 30° C. to about 100° C. using a heating device. In some embodiments, the method further includes cooling the cleaning solution from about −10° C. to about 10° C. using a cooling device. In some embodiments, the method further includes monitoring the temperature of the cleaning solution using a temperature sensor. In some embodiments, the method further includes adjusting the temperature of the cleaning solution based on types of the CMP contaminants on the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A cleaning system, comprising:
at least one cleaning module configured to remove contaminants on a substrate after a chemical mechanical polishing (CMP) process, the at least one cleaning module comprising:
a first cleaning module configured to perform a first cleaning process on the substrate which has been polished by a polishing system, the first cleaning module comprising a tank to hold a first cleaning solution therein, a holder disposed at a bottom of the tank and configured to vertically support the substrate during the first cleaning process, and a transducer configured to transmit an acoustic energy having a frequency in the range from about 500 kHz to about 2.5 MHz to the first cleaning solution to agitate the first cleaning solution;
a second cleaning module configured to perform a second cleaning process on the substrate which has been polished by the polishing system, the second cleaning module comprising a platen configured to support the substrate, a cleaning pad configured to scrub a front side surface of the substrate, and a pair of first spray bars configured to spray a second cleaning solution to the front side surface and a backside surface of the substrate, respectively; and
a third cleaning module configured to perform a third cleaning process on the substrate which has been polished by the polishing system, the third cleaning module comprising a pair of brushes configured to scrub the front side and backside surfaces of the substrate, and a pair of second spray bars configured to spay a third cleaning solution to the front side and backside surfaces of the substrate, respectively; and
a cleaning solution supply system fluidically coupled to the first, second and third cleaning modules and configured to supply the first, second and third cleaning solutions to the first, second and third cleaning modules, respectively, wherein the cleaning solution supply system comprises at least one temperature control system, the at least one temperature control system comprising:
a heating device configured to heat the first, second or third cleaning solution to a temperature between 30° C. to 100° C.;
a cooling device configured to cool the first, second or third cleaning solution to a temperature between −10° C. to 10° C.;
a temperature sensor configured to monitor the temperature of the first, second or third cleaning solution; and
a temperature controller configured to control the temperature of the first, second or third cleaning solution by at least:
comparing the temperature of the first, second or third cleaning solution with a target temperature that is determined based on types of the contaminants to be removed; and
instructing the heating device or the cooling device to heat or cool the first, second or third cleaning solution until the target temperature has been reached.

2. The cleaning system of claim 1, wherein the temperature sensor comprises a thermocouple, a resistance temperature detector, or a thermistor.

3. The cleaning system of claim 1, wherein the first, second and third cleaning solutions independently comprise an acidic solution or a base solution.

4. The cleaning system of claim 1, wherein the first, second and third cleaning solutions independently comprise hydrofluoric acid, phosphoric acid, ammonium hydroxide, hydrogen peroxide, or a mixture thereof.

5. The cleaning system of claim 1, wherein the first, second and third cleaning solutions independently comprise deionized water.

6. The cleaning system of claim 1, wherein the first, second and third cleaning solutions independently comprise chloroform, dichloromethane, benzene, acetone, or mixtures thereof.

7. The cleaning system of claim 1, wherein the heating device comprises a resistance heater.

8. The cleaning system of claim 1, wherein the cooling device comprises a refrigeration compressor.

9. The cleaning system of claim 1, wherein the cleaning solution supply system further comprises a plurality of cleaning fluid source tanks, each of which configured to hold a cleaning fluid for preparing the first, second and third cleaning solutions.

10. The cleaning system of claim 9, wherein the cleaning solution supply system further comprises a chemical mixer placed between the plurality of cleaning fluid source tanks and the at least one temperature control system and configured to mix the cleaning fluid from each of the plurality of cleaning fluid source tanks.

11. The cleaning system of claim 1, further comprising a substrate handler configured to transfer the substrate through the first cleaning module, the second cleaning module and the third cleaning module.

12. The cleaning system of claim 1, further comprising a drying module configured to dry the substrate prior to transferring the substrate out of the cleaning system.

13. A chemical mechanical polishing (CMP) system, comprising:
a polishing system configured to polish a substrate; and
a cleaning system comprising:
a first cleaning module configured to clean the substrate which has been polished by the polishing system, the first cleaning module comprising a tank to hold a first cleaning solution therein, a holder configured to vertically support the substrate during cleaning, and a transducer configured to transmit a megasonic acoustic energy to the first cleaning solution to agitate the first cleaning solution;
a second cleaning module configured to clean the substrate which has been cleaned by the first cleaning module, the second cleaning module comprising a platen configured to support the substrate, a cleaning pad configured to scrub a front side surface of the substrate, and a pair of first spray bars configured to spray a second cleaning solution to the front side surface and a backside surface of the substrate, respectively;
a third cleaning module configured to clean the substrate which has been cleaned by the second cleaning module, the third cleaning module comprising a pair of brushes configured to scrub the front side and backside surfaces of the substrate, and a pair of second spray bars configured to spay a third cleaning solution to the front side and backside surfaces of the substrate, respectively; and
a cleaning solution supply system fluidically coupled to the first, second and third cleaning modules and configured to supply the first, second and third cleaning solutions to the first, second and third cleaning modules, respectively, the cleaning solution supply system comprising a temperature control system configured to control a temperature of each of the first cleaning solution, the second cleaning solution and the third cleaning solution, wherein the temperature control system comprises:
a heating device configured to heat a corresponding cleaning solution to a temperature between 30° C. to 100° C.;
a cooling device configured to cool a corresponding cleaning solution to a temperature between −10° C. to 10° C.;
a temperature sensor configured to monitor the temperature of the corresponding cleaning solution; and
a temperature controller configured to:
compare the temperature of the corresponding cleaning solution with a target temperature that is determined based on types of contaminants to be removed; and
in response to the target temperature not being reached, control the heating device or the cooling device to heat or cool the corresponding cleaning solution until the target temperature has been reached.

14. The CMP system of claim 13, wherein further comprising a loading robot configured to transfer the substrate from the polishing system to the cleaning system.

15. The CMP system of claim 13, wherein the megasonic acoustic energy has a frequency ranging from about 500 kHz to about 2.5 MHz.

16. A chemical mechanical polishing (CMP) system comprising a cleaning system, the cleaning system comprising:
a plurality of cleaning modules configured to remove contaminants from a substrate after a CMP process, the plurality of cleaning modules comprising:
a first cleaning module configured to remove the contaminants from the substrate using a megasonic acoustic energy with a first cleaning solution;
a second cleaning module configured to remove the contaminants from the substrate by scrubbing a front side surface of the substrate using a cleaning pad with a second cleaning solution;
a third cleaning module configured to remove the contaminants from the substrate by simultaneously scrubbing the front side surface and a backside surface of the substrate using a pair of brushes with a third cleaning solution; and
a cleaning solution supply system fluidically coupled to the first, second and third cleaning modules and configured to supply the first, second and third cleaning solutions to the first, second and third cleaning modules, respectively, the cleaning solution supply system comprising a temperature control system configured to control a temperature of each of the first cleaning solution, the second cleaning solution and the third cleaning solution, wherein the temperature control system comprises:
a heating device configured to heat a corresponding cleaning solution to a temperature between 30° C. to 100° C.;

a cooling device configured to cool a corresponding cleaning solution to a temperature between −10° C. to 10° C.;

a temperature sensor configured to monitor the temperature of the corresponding cleaning solution; and a temperature controller configured to:

compare the temperature of the corresponding cleaning solution with a target temperature that is determined based on types of the contaminants to be removed; and in response to the target temperature not being reached, control the heating device or the cooling device to heat or cool the corresponding cleaning solution until the target temperature has been reached.

17. The CMP system of claim 16, further comprising a polishing system where the CMP process is performed.

18. The CMP system of claim 16, wherein the cleaning system further comprising a spin-rinse-dry module configured to rinse the substrate and dry the before the substrate exits the cleaning system.

19. The CMP system of claim 16, wherein the temperature control system further comprises a power source configured to supply power to the heating device and the cooling device.

20. The CMP system of claim 16, wherein the temperature sensor is a type S, B, K, E, J, T, or N thermal coupler.

* * * * *